(12) United States Patent
Cheng et al.

(10) Patent No.: US 7,200,786 B2
(45) Date of Patent: Apr. 3, 2007

(54) BUILT-IN SELF-ANALYZER FOR EMBEDDED MEMORY

(76) Inventors: Wu-Tung Cheng, 19030 SW. 35th Pl., Lake Oswego, OR (US) 97034; Joseph Rayhawk, 15248 NW. Germantown Rd., Portland, OR (US) 97231; Xiaogang Du, 29850 SW. Ashland Dr., #26, Wilsonville, OR (US) 97070

( * ) Notice: Subject to any disclaimer, the term of this patent is extended or adjusted under 35 U.S.C. 154(b) by 465 days.

(21) Appl. No.: 10/749,283

(22) Filed: Dec. 30, 2003

(65) Prior Publication Data
US 2004/0210803 A1 Oct. 21, 2004

Related U.S. Application Data

(60) Provisional application No. 60/463,406, filed on Apr. 15, 2003.

(51) Int. Cl.
*G01R 31/28* (2006.01)
*G11C 29/00* (2006.01)
*G06F 11/00* (2006.01)
*G06F 17/50* (2006.01)

(52) U.S. Cl. .................. 714/733; 714/718; 714/39; 365/201; 716/4

(58) Field of Classification Search ............ None
See application file for complete search history.

(56) References Cited

U.S. PATENT DOCUMENTS 6,085,334 A * 7/2000 Giles et al. ............... 714/7

6,421,286 B1 * 7/2002 Ohtani et al. ............ 365/200
6,634,003 B1 * 10/2003 Phan ........................ 714/710

OTHER PUBLICATIONS

Bhavsar, "An Algorithm for Row-Column Self-Repair of RAMs and Its Implementation in the Alpha 21264", Proc. IEEE Int'l Test Conference, pp. 311-318 (1999).
Haddad et al., "Increased Throughput for the Testing and Repair of RAM's with Redundancy," *IEEE Transactions on Computers*, vol. 40, No. 2, pp. 154-166 (Feb. 1991).
Horstmann et al., "Metastability Behavior of CMOS ASIC Flip-Flops in Theory and Test," *IEEE Journal of Solid-State Circuits*, vol. 24, No. 1, pp. 146-157 (Feb. 1989).
Kawagoe et al., "A Built-in Self-repair Analyzer (CRESTA) for Embedded DRAMs", Proc. IEEE Int'l Test Conference, pp. 567-574 (2000).
Kim et al., "Built In Self Repair for Embedded High Density SRAM", *Proc. IEEE Int'l Test Conference*, pp. 1112-1119 (1998).
Nakahara et al., "Built in Self-test for GHz Embedded SRAMs Using Flexible Pattern Generator and New Repair Algorithm", *Proc. IEEE Int'l Test Conference*, pp. 301-310 (1999).

(Continued)

Primary Examiner—Phung My Chung
(74) *Attorney, Agent, or Firm*—Klarquist Sparkman, LLP

(57) ABSTRACT

Methods and apparatus for analyzing memory defects in an embedded memory are described. According to certain embodiments, the analysis can be performed "at-speed" and can be used to analyze multi-bit failures in words of a word-oriented memory. According to some embodiments, the analysis comprises updating a record of column defects not repaired by spare rows as the memory is being tested. The record can be evaluated after a test to determine whether a repair strategy can successfully repair a memory-under-test.

58 Claims, 10 Drawing Sheets

OTHER PUBLICATIONS

Powell et al., "BIST for Deep Submicron ASIC Memories with High Performance Application", *ITC 2003* (to appear).

Shoukourian et al., "An Approach for Evaluation of Redundancy Analysis Algorithms", *Proc. IEEE MTDT Workshop*, San Jose, pp. 51-55, 2001.

Venkatesh et al., "A Fault Modeling Technique to Test Memory BIST Algorithms", *Memory Technology, Design and Testing, Proc. of the 2002 IEEE Int'l Workshop*, pp. 109-116 (2002).

Zorian, "Embedded Memory Test & Repair: Infrastructure IP for SOC Yield", *Proc. IEEE Int'l Test Conference*, pp. 340-349 (2002).

* cited by examiner

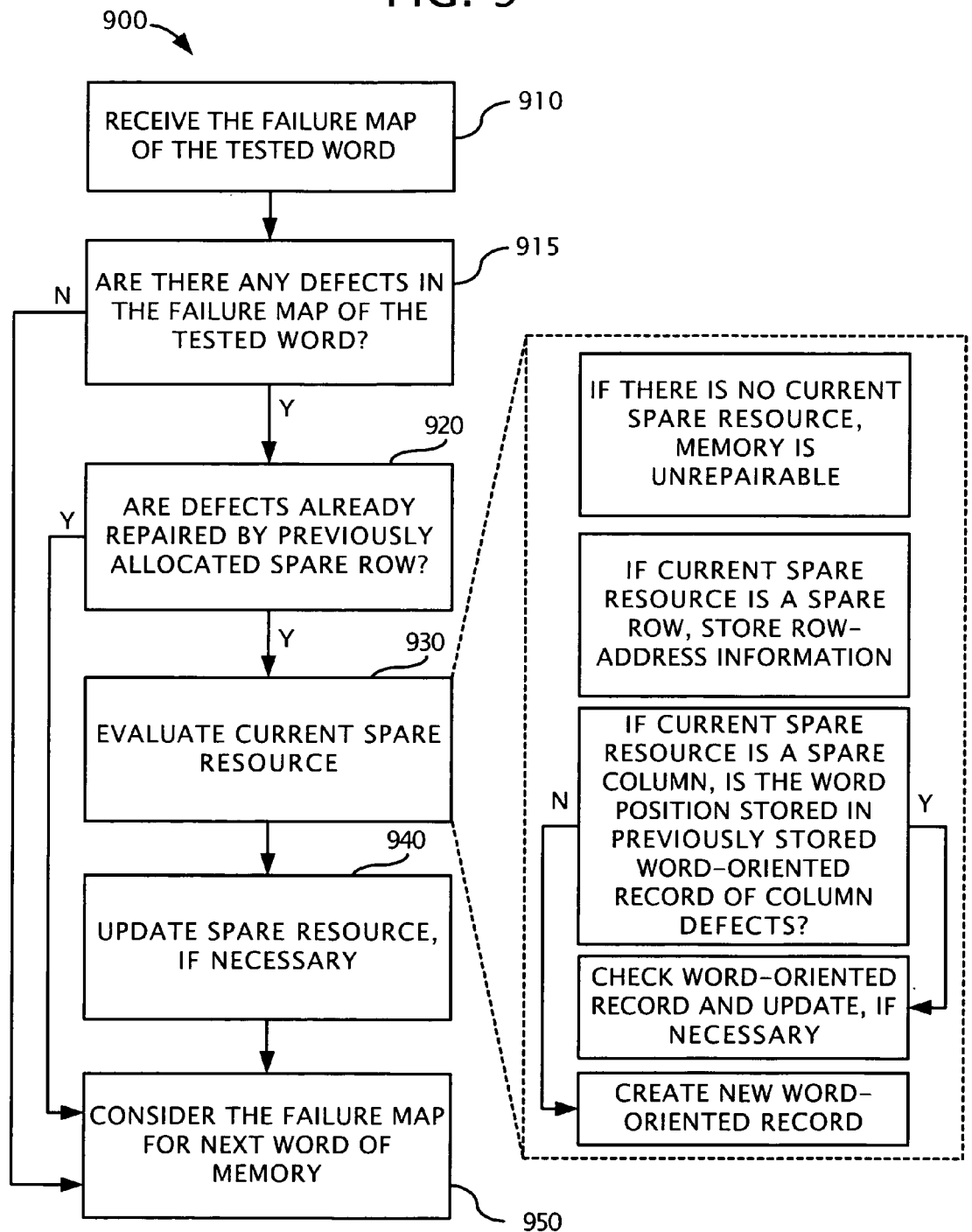

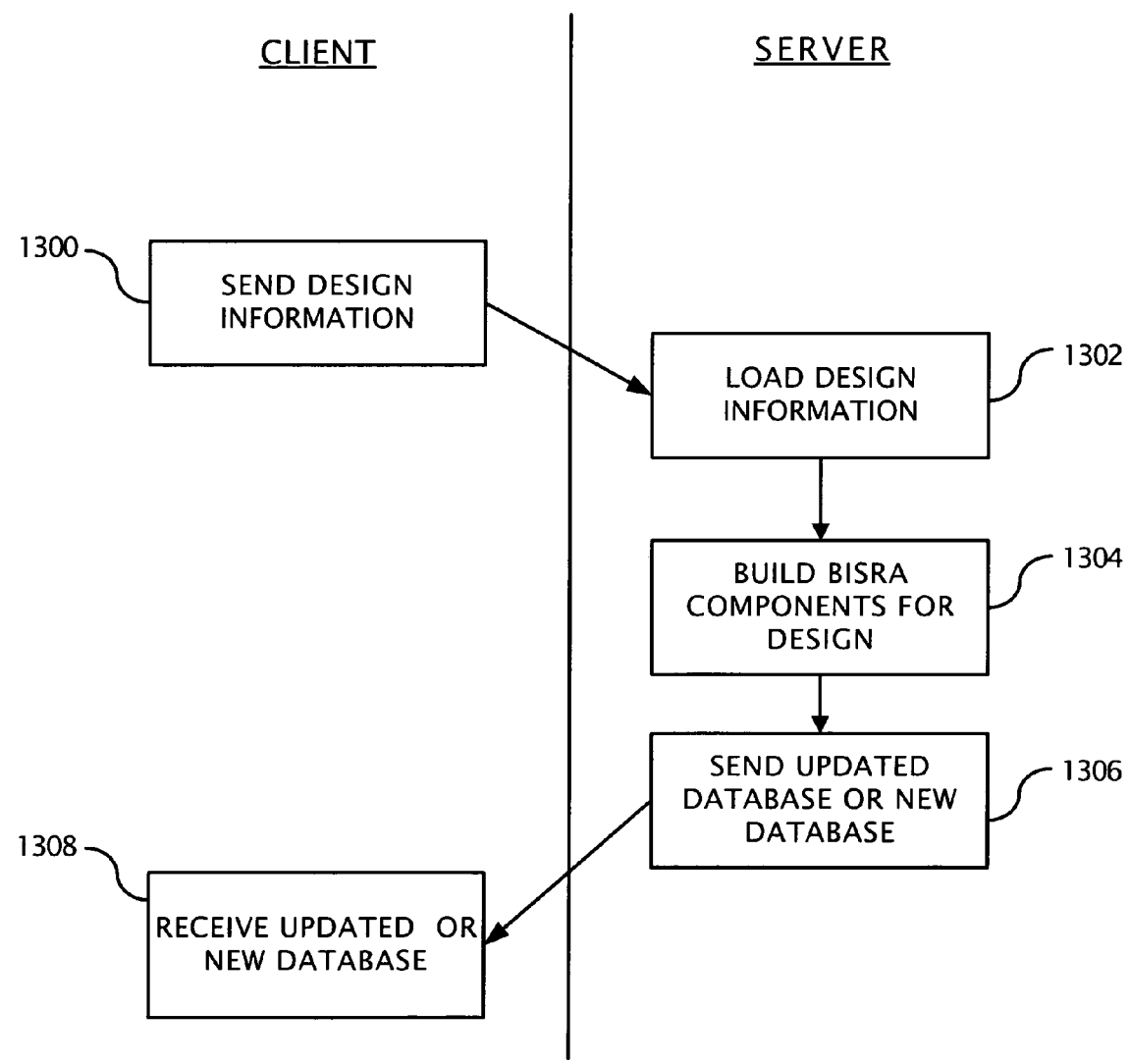

BUILT-IN SELF-ANALYZER FOR EMBEDDED MEMORY

CROSS REFERENCE TO RELATED APPLICATION

This application claims the benefit of U.S. Provisional Application No. 60/463,406, filed Apr. 15, 2003, which is hereby incorporated by reference.

TECHNICAL FIELD

This invention relates generally to testing integrated circuits, and more particularly to testing embedded memories of integrated circuits.

BACKGROUND

In modern integrated-circuit design, embedded memories occupy a large area of the chip. In modern microprocessors, for example, embedded memories often occupy more than 30% of the chip area, and in a system-on-a-chip (SOC), they may occupy more than 60% of the chip area. Indeed, the percentage of chip area occupied by embedded memories in SOCs is expected to rise to 94% in the next decade. Consequently, the yield of embedded memories will likely be determinative of the yield of SOCs.

Embedded memories typically comprise some of the densest physical structures on a chip and have some of the smallest feature sizes. Consequently, memories are usually more sensitive to defects than combinational logic. A common solution for addressing defective memories is to include one or more spare rows and/or columns in the memory array. The spare row and/or columns can be activated if a memory test determines that a standard memory row or column is defective. One memory-testing scheme that can be used to detect defects in a memory is known as built-in self-test (BIST) and involves locating the test-generation and test-analyzing hardware onto the chip itself. BIST schemes typically utilize some type of built-in self-repair analyzer (BISRA) to analyze the failure information detected and to determine how to repair a memory using the available spare rows or spare columns to cover all faulty cells. The repair information determined can then be sent to the on-chip repair logic or to external repair equipment that performs the actual physical repair.

Because the failure information determined by the BIST hardware can be fairly large, it is not practical to store all the information in the BISRA. Accordingly, a typical BISRA has to allocate a spare row or a spare column at the time each failure is detected. The order in which the spare rows and/or spare columns are allocated by the BISRA is referred to as a "repair strategy." Although some of the known BISRA schemes and repair strategies are capable of performing repair functions for bit-oriented memories, they do not adequately support word-oriented memories. Moreover, the known BISRA schemes do not adequately handle multi-bit errors during at-speed testing of the memory.

One of the known BISRA schemes, known as the comprehensive real-time exhaustive search test and analysis (CRESTA) algorithm, simultaneously searches all possible repair strategies of a bit-oriented memory and processes each repair strategy in separate BISRA engines. See Kawagoe T. et al., "A Built-In Self-Repair Analyzer (CRESTA) for Embedded DRAMs," Proc. IEEE Int'l Test Conference 2000, pp. 567–574 (2000). The CRESTA method relies on using multiple BISRA engines to serially repair defects as they are encountered in accordance with a BISRA engine's respective repair strategy. For example, if a memory has two spare rows and two spare columns, six repair strategies are analyzed using six BISRAs: RRCC, RCRC, RCCR, CRRC, CRCR, and CCRR, where C and R represent a spare column and a spare row, respectively. In general, the total number of possible spare-resource orderings is given by:

$$\frac{(m+n)!}{m!n!}, \qquad (1)$$

wherein m is the number of spare rows available and n is the number of spare columns available. Thus, for the example above where m=2 and n=2, the total number of possible spare-resource orderings is six. The total number of possible spare-resource orderings is sometimes referred to herein using the notation "C(m+n, m)."

The CRESTA method uses C(m+n, m) sub-analyzers to analyze the incoming row/column address information of faulty memory cells and to allocate the available repair resources according to all possible repair strategies. For example, a sub-analyzer using the repair strategy RRCC will allocate a spare row to the first faulty cell discovered, allocate another spare row to the next faulty cell discovered if the cell is not in the same row as the first faulty cell, allocate a spare column to the next faulty cell that is not in any faulty row already discovered, and finally allocate the second spare column to the next-discovered faulty cell that is neither in any faulty row already discovered nor in the same column as the memory cell repaired by the first spare column. If at least one of the sub-analyzers finds a successful repair strategy for repairing defects in memory, the chip is deemed repairable; otherwise, the chip is deemed unrepairable.

In the CRESTA method, each sub-analyzer stores the row address or the column address of a faulty memory cell whenever a respective spare row or spare column is allocated. When the next faulty memory cell is discovered, the stored addresses are checked to determine whether the memory cell can be repaired by a previously allocated spare resource. Consequently, the CRESTA method is unable to adequately handle at-speed multiple-bit failure analysis occurring in word-oriented memories. In particular, the CRESTA method cannot determine the number of spare columns needed for all failure bits in a word during a single clock cycle. Instead, in order to detect multi-bit errors, the CRESTA method must be paused or stopped. Some memory faults, however, are timing critical and cannot be detected if the BIST process is paused or stopped. Thus, a BISRA scheme that does not operate at-speed can miss critical errors in the memory and produce incomplete test results. Moreover, the time required to perform a self-test is not trivial.

Moreover, as more spare rows and columns are made available on an IC, the number of sub-analyzers required to implement the CRESTA method rises exponentially. At some point, the chip area used by sub-analyzers and spare memory resources will cost more than accepting the lower yields of ICs built without spare resources.

Accordingly, there is a need for an improved built-in self-repair analyzer scheme. Although not required, such an improved system can be used, for example, to detect and analyze multi-bit failures of a word-oriented memory and can also be used at the operating speed of the memory. Operating at-speed can not only detect faults in the memory that are undetectable using conventional schemes, but can significantly reduce the time required for testing.

SUMMARY

In view of the issues and concerns described above, various methods and apparatus for analyzing test results of a memory are disclosed. The disclosed methods and apparatus should not be construed as limiting in any way. Instead, the present disclosure is directed toward novel and nonobvious features and aspects of the various disclosed embodiments, alone and in various combinations and subcombinations with one another. The methods and apparatus are not limited to any specific aspect or feature or combinations thereof, nor do the disclosed methods and apparatus require that any one or more specific advantages be present or problems be solved.

One of the disclosed embodiments is a method of analyzing a repair strategy for applying spare memory resources to a memory-under-test. According to this embodiment, words of the memory-under-test are tested for one or more defects, desirably at an operating speed of the memory-under-test. A record of column defects is updated, desirably at substantially the operating speed of the memory-under-test. The record of column defects indicates the defects not repaired by spare rows. The record of column defects is evaluated after the testing to determine whether the memory-under-test is repairable using the repair strategy. The method can further comprise sending row-address information and column-address information to external test equipment if the evaluating determines that the memory-under-test is repairable using the repair strategy. In one embodiment, if multiple defects are found in a word tested, the record of column defects is updated to include the multiple defects. In some embodiments, the record of column defects comprises a set of bits, wherein each bit in the set corresponds to a respective column in the memory-under-test and has a value indicative of whether a defect was found in the respective column. For example, the record of column defects can be a "column repair vector" comprising a set of bits stored in memory elements, wherein each bit in the set corresponds to a respective column in the memory-under-test. In some embodiments, the record of column defects is updated by logically ORing a failure map from a word-under-test with at least a portion of the current record of column defects. In certain embodiments, the record of column defects is updated if a current spare resource is a spare column and if the one or more defects from a current word being tested are not found in a current record of column defects or are covered by a previously allocated spare resource. The memory-under-test can be a multiplexed memory, in which case the record of column defects can comprise multiple "word-oriented column repair vectors," wherein each vector is associated with a particular word position in the multiplexed memory. In this embodiment, the number of bits in the word-oriented column repair vectors can be less than the number of bits in a row of the memory-under-test. The disclosed method can be performed simultaneously or sequentially for multiple different repair strategies.

Embodiments of a method for performing a self-repair analysis of a memory are also disclosed. In one embodiment, the memory comprises a plurality of memory cells arranged into rows and columns. According to this embodiment, a failure map associated with a test of a word in the memory is received. The word of the memory comprises at least two memory cells from a respective row of the memory, and each memory cell of the word corresponds to a different column in the respective row. A determination is made as to which columns in the word have a defect based on the failure map. A current spare resource is evaluated if one or more defects are found in the word and are not found in a record of column defects. If the current spare resource is a spare column, the act of evaluating comprises logically updating the record of column defects with the failure map to include the one or more defects, and advancing the current spare resource to a next spare resource according to a selected repair strategy. The act of evaluating may further comprise storing corresponding row information if the current spare resource is a spare row. In some embodiments, the record of column defects comprises a set of bits, wherein each bit of the set corresponds to a respective column of the memory and has a value indicative of whether a defect is found in the respective column during a memory test of multiple words in the memory. For example, the record of column defects can comprise a column repair vector comprising a set of bits stored in memory elements, wherein each bit of the set corresponds to a respective column in the memory. In other embodiments, in which the memory is a multiplexed memory, the record of column defects comprises multiple word-oriented column repair vectors. Each word-oriented column repair vector can comprise a first portion corresponding to respective columns in the memory-under-test and a second portion corresponding to word-position information. In certain embodiments, the record of column defects is updated by logically ORing the failure map with at least a portion of the record of column defects. In one embodiment of the method, a determination is made as to whether the selected repair strategy is successful by evaluating the record of column defects as the record of column defects is updated. The disclosed method can be performed simultaneously (e.g., by (C(m+n, m)−1) or fewer built-in self-repair analyzers) or sequentially using multiple different repair strategies.

Embodiments of a method for repairing a memory using multiple repair strategies are also disclosed. According to one embodiment, defects in the memory are analyzed in a first test using a first repair strategy. The first repair strategy may comprise a predetermined order of spare resources that are applied sequentially to the defects of the memory. A determination is made as to whether the memory is repairable using the first repair strategy. If the first repair strategy fails to repair the memory, a failing portion of the first repair strategy is identified, wherein the failing portion corresponds to a sequence of the spare resources applied to the defects of the memory before the first repair strategy failed. Subsequent tests of the memory are eliminated if they use repair strategies that begin with the failing portion of the first repair strategy. In one embodiment, the first test of the memory desirably comprises testing words of the memory at an operating speed of the memory, and updating a record of column defects, desirably at substantially the operating speed of the memory-under-test (the record of column defects indicating the defects not repaired by spare rows). In another embodiment, the determination of whether the first repair strategy is successful can be performed as the spare resources of the first repair strategy are being applied to the defects of the memory. In yet another embodiment, this determination can be performed by evaluating a record of column defects. In certain implementations of this embodiment, the record of column defects is a column repair vector comprising a set of bits, wherein each bit in the set corresponds to a respective column in the memory. In certain other implementation of this embodiment, the memory has a multiplexed architecture and the record of column defects comprises multiple word-oriented column repair vectors. In this embodiment, each word-oriented column repair vector comprises a set of bits such that a first portion of the bits corresponds to respective columns in the memory-under-test and the second portion of the bits corresponds to word-position information.

Any of the disclosed methods can be performed by a built-in self-repair analyzer (BISRA) of an integrated circuit. Additionally, any of the disclosed methods can be performed by a BISRA at least partially designed using a computer program comprising computer-executable instructions stored on a computer-readable medium. Moreover, any of the disclosed methods can be performed by a BISRA stored as design information in a design database stored on a computer-readable medium.

Integrated circuit embodiments are also disclosed. One embodiment of the disclosed integrated circuit comprises a memory array. The memory array in this example comprises a plurality of memory cells arranged into rows and columns, wherein at least some of the rows in the memory array comprise one or more memory words formed from m memory cells (m being an integer greater than or equal to two). The integrated circuit of this embodiment may further comprise at least two spare memory resources, the at least two spare memory resources comprise one or more spare memory columns assignable to repair faulty columns in the memory array and one or more spare memory rows assignable to repair faulty rows in the memory array. The integrated circuit may also comprise a built-in self-test (BIST) circuit configured to generate and apply test patterns to the memory words of the memory array and to generate failure maps and address information for the memory words tested. The integrated circuit may further comprise a BISRA coupled to the BIST circuit and configured to receive the failure map and the address information for the memory words tested and to evaluate one or more repair strategies for applying the spare resources to the memory array.

The BISRA may comprise a set of at least n memory elements that form a record of column defects, wherein at least some of the n memory elements correspond to respective columns of the words tested and have a value indicative of whether a defect is found in the corresponding column. In some embodiments, m is equal n. In certain embodiments, the set of memory elements is logically updated with a respective failure map when a respective word tested contains a defect to be repaired with a spare column. In other embodiments, the one or more repair strategies comprise a first repair strategy and a second repair strategy, and the BISRA is configured to restart the BIST circuit if the first repair strategy fails and to evaluate the second repair strategy. In still other embodiments, the one or more repair strategies are a plurality of repair strategies, and the BISRA is configured to evaluate the plurality of repair strategies, for example, sequentially. In one implementation of these embodiments, the plurality of repair strategies are generated by hardware in the BISRA (e.g., a linear feedback shift register (LFSR)). In certain other embodiments, the BISRA is a first BISRA of multiple BISRAs and the one or more repair strategies are a plurality of repair strategies. In these embodiments, the multiple BISRAs are configured to evaluate the plurality of repair strategies simultaneously. The integrated circuit of these embodiments can further comprise a determination circuit configured to select an optimal repair strategy from successful repair strategies evaluated by the first BISRA and the additional BISRAs. In some embodiments, the memory array has a linear architecture. Alternatively, the memory array can have a multiplexed architecture. In these embodiments, the set of memory elements comprises multiple word-oriented column repair vectors, wherein each word-oriented column repair vector comprises a first subset of memory elements associated with word-address information and a second subset of memory elements associated with the respective columns of the words tested and having values indicative of whether defects are found in the corresponding columns. In some implementations of these embodiments, n is less than m (e.g., n is less than m/2).

In another disclosed embodiment of the integrated circuit, the integrated circuit comprises a word-oriented memory, with a mechanism for testing words of the memory at an operating speed of the memory and evaluating one or more spare resources according to a repair strategy (each of the one or more spare resources comprising either a spare row or a spare column), and a mechanism for updating a record of column defects when a current spare resource being evaluated is a spare column and when one or more defects detected are not recorded in the record of column defects (the record of column defects being updated at substantially the operating speed of the memory). The integrated circuit can further comprise a mechanism for evaluating the record of column defects after the testing is performed to determine whether the memory is repairable using the repair strategy.

Any of the disclosed integrated circuits may be at least partially designed by a computer program comprising computer-executable instructions stored on a computer-readable medium. Moreover, any of the disclosed integrated circuits may be stored as design information in a design database stored on a computer-readable medium.

These and other features are set forth below with reference to the accompanying drawings.

BRIEF DESCRIPTION OF THE DRAWINGS

FIG. 9 is a flowchart of an exemplary method for analyzing test results during BIST for a memory having a multiplexed architecture.

FIG. 13 is a flowchart showing the creation of a database using, for example, the network of FIG. 12.

DETAILED DESCRIPTION

Figure 1:
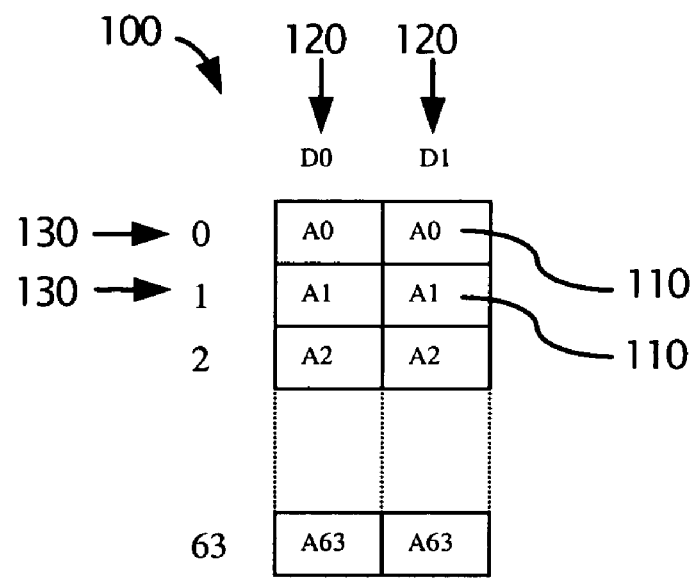
FIG. 1 is a schematic block diagram illustrating an exemplary linear memory architecture.

Disclosed below are representative embodiments of methods and apparatus for analyzing test results of a memory. The disclosed methods and apparatus should not be construed as limiting in any way. Instead, the present disclosure is directed toward novel and nonobvious features and aspects of the various disclosed embodiments, alone and in various combinations and subcombinations with one another. The methods and apparatus are not limited to any specific aspect or feature or combinations thereof, nor do the disclosed methods and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "evaluate" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be applied to a wide variety of integrated circuits or digital devices (e.g., application-specific integrated circuits (ASICs), field-programmable gate arrays (FPGAs), systems-on-a-chip (SOCs), or other such devices) having one or more embedded memory arrays (e.g., static RAMs (SRAMs), dynamic RAMs (DRAMs), or other such memory devices). The integrated circuit or digital device may, but does not necessarily, include other BIST hardware used to generate and apply test patterns to the memory. Moreover, the disclosed methods and apparatus can be used to test multiple memories embedded an integrated circuit (i.e., one set of BISRA components cam be used to test multiple embedded memories on a chip). Further, some of the apparatus described herein can be designed, simulated, and/or verified using software stored on a computer-readable medium and executed on a computer. Such software can comprise, for example, electronic-design-automation (EDA) software tools, such as design and verification tools. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

All of the memory repair schemes described herein can be run at boot time (soft repair) or at the factory (hard repair). In general, soft repair allows a chip to test and repair its functionality each time it is reset or powered up. A soft-repair scheme may require extra on-board resources (e.g., flash memory or an equivalent) to keep track of defects and to route repair resources. By contrast, hard repair may involve blowing on-board fuses or an equivalent to effectuate the repair after testing is completed.

The embodiments described below are generally used in connection with word-oriented embedded memories, but may be modified for use with bit-oriented memories. There are two principle architectures presently associated with word-oriented memories: linear architecture and multiplexed architecture. FIG. 1 is a schematic diagram illustrating an exemplary linear-architecture memory 100. In the exemplary linear-architecture memory 100, the memory cells 110 are aligned in linear sequences within the memory array such that the number of columns per row is equal to the word width of the memory. For example, the illustrated architecture 100 has two columns 120, which are labeled in FIG. 1 as "D0" and "D1." Further, the illustrated memory has sixty-four rows 130, which are labeled in FIG. 1 as "0" through "63." Thus, the memory illustrated in FIG. 1 stores sixty-four two-bit words, which are addressable via six-bit word addresses (i.e., $2^6=64$), which are labeled in FIG. 1 as "A0" through "A63."

Figure 2:
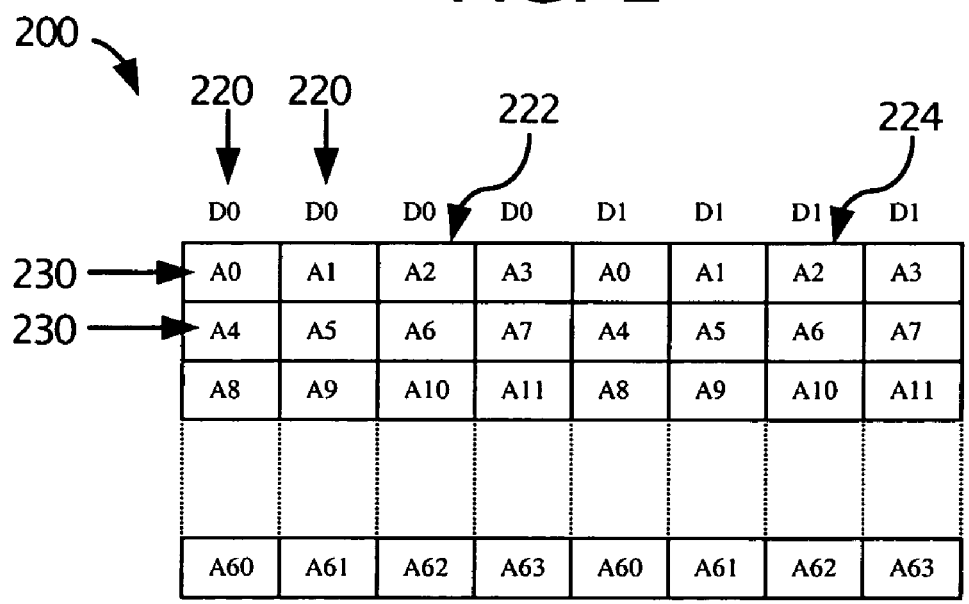
FIG. 2 is a schematic block diagram illustrating an exemplary multiplexed memory architecture.

FIG. 2 is a schematic diagram illustrating an exemplary multiplexed-architecture memory 200. In the illustrated memory 200, each word address is divided into two parts: a column address and a row address. Further, in the illustrated embodiment and in a typical multiplexed memory, each row 230 contains more than one word such that an aspect ratio (i.e., the ratio of the length of the memory block to the width of the block) is normalized. The level of normalization for a given row 230 (i.e., the number of words in a given row) is defined as the memory's mux level. For example, the mux level of the illustrated memory 200 is four because each row 230 contains four two-bit words. As is also illustrated by the memory 200 in FIG. 2, two columns 220 of the same word (e.g., column 222 and column 224 of word "A0") are not located successively within the memory array. In general, the multiplexed arrangement reduces the likelihood of cross-coupling between bits of the same word.

Figure 3:
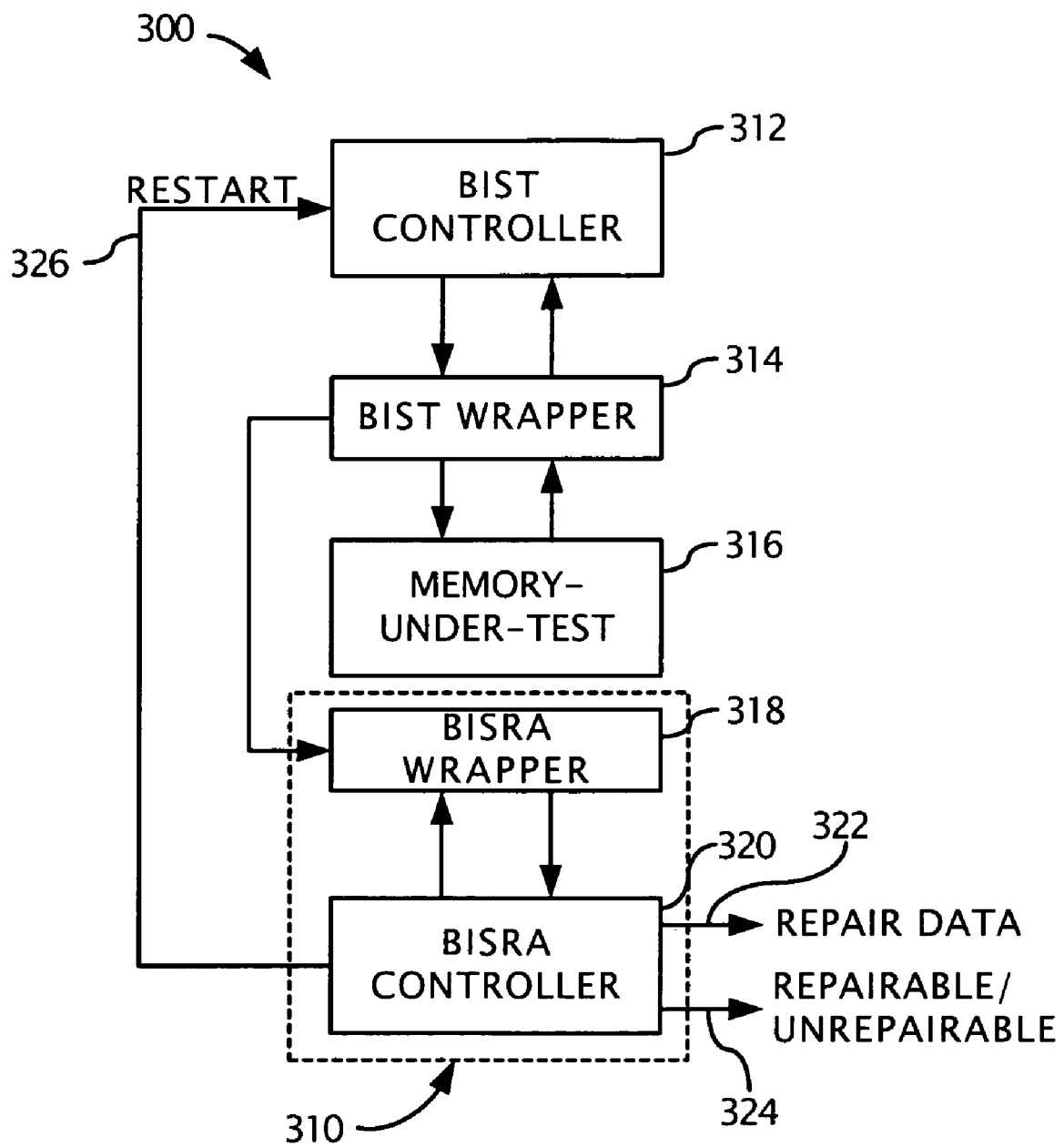
FIG. 3 is a schematic block diagram illustrating a BIST architecture that utilizes an exemplary embodiment of the disclosed built-in-self-repair-analyzer (BISRA) scheme.

FIG. 3 is a schematic diagram of an exemplary BIST architecture 300 that includes a representative embodiment of a built-in self-repair analyzer (BISRA) 310 according to the disclosed technology. In particular, FIG. 3 shows the functional components of the BIST architecture 300 and the BISRA 310 and an example of how they can be coupled to one another. In the embodiment shown in FIG. 3, a BIST controller 312 generates, for example, memory test data, test addresses, and control signals used to test a memory-under-test 316. A BIST wrapper 314 applies the memory test data to the memory-under-test 316 and generates failure maps that indicate whether a particular word tested has any failing memory cells or defects. The failure map can be generated, for example, by writing test data into a memory word, reading the memory word to obtain an output from the memory word, and comparing the output with expected data. The BIST wrapper 314 is also coupled to a BISRA wrapper 318 such that it can send the failure map and the corresponding memory address to the BISRA wrapper 318. The BISRA wrapper desirably includes one or more BISRA engines configured to evaluate and analyze the failure maps using one or more repair strategies. The BISRA wrapper 318 is controlled by a BISRA controller 320. Outputs from the BISRA controller 320 comprise, for example, a repair-data path 322, which can be used to send repair information to a component that actually performs the memory repair (e.g., automatic test equipment (ATE)), and a repairable/unrepairable signal 324, which can be used to indicate whether or not the memory is repairable. In some embodiments, the BISRA controller 320 is further configured to restart the BIST controller 312 via a restart path 326.

Figure 4:
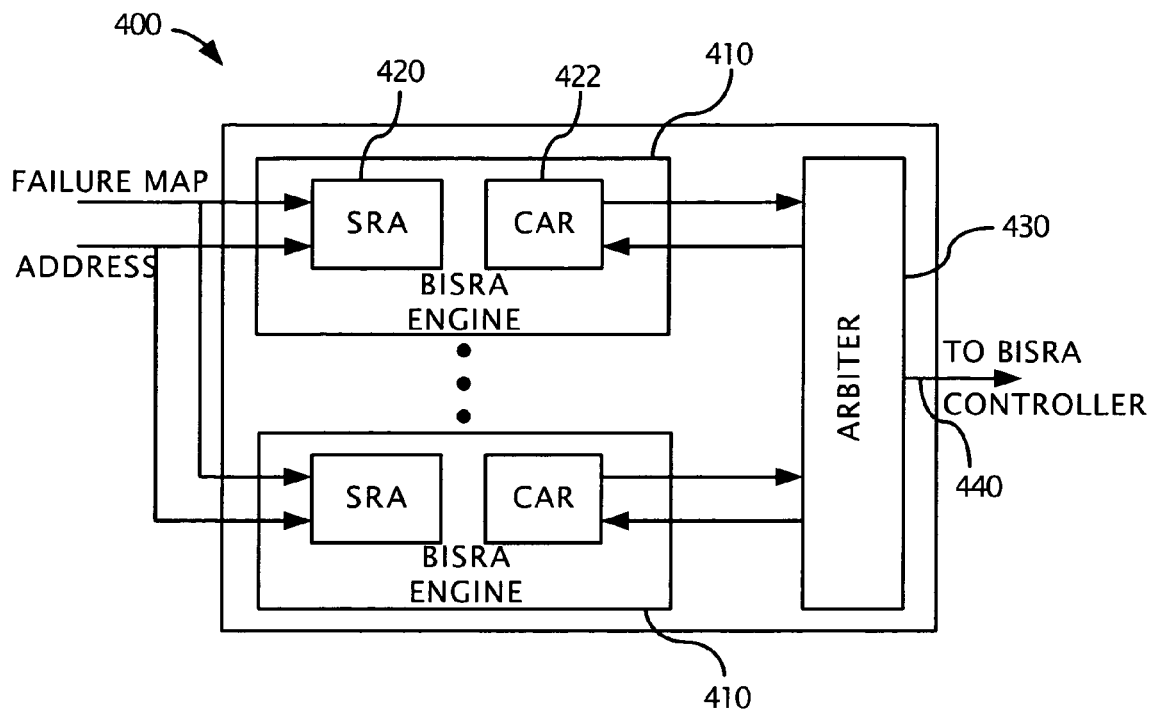
FIG. 4 is a schematic diagram showing an exemplary BISRA wrapper utilizing multiple BISRA engines as can be used in the BIST architecture of FIG. 3.

FIG. 4 shows an exemplary embodiment 400 of the BISRA wrapper 318. In the illustrated embodiment, multiple BISRA engines 410 are used to apply various repair strategies to the failure maps input from the BIST wrapper 314. For example, according to one desirable embodiment, the BISRA wrapper 318 contains C(m+n, m) BISRA engines 410. In this embodiment, each BISRA engine 410 applies a different repair strategy for allocating spare resources to the memory-under-test 316 (e.g., for a memory array having two spare rows and two spare columns, six BISRA engines apply six respective repair strategies: RRCC, RCRC, RCCR, CRRC, CRCR, and CCRR). In one particular implementation of this embodiment, the multiple BISRA engines 410 are operated in parallel in order to evaluate all relevant repair strategies during a single test of the memory-under-test 316.

Figure 5:
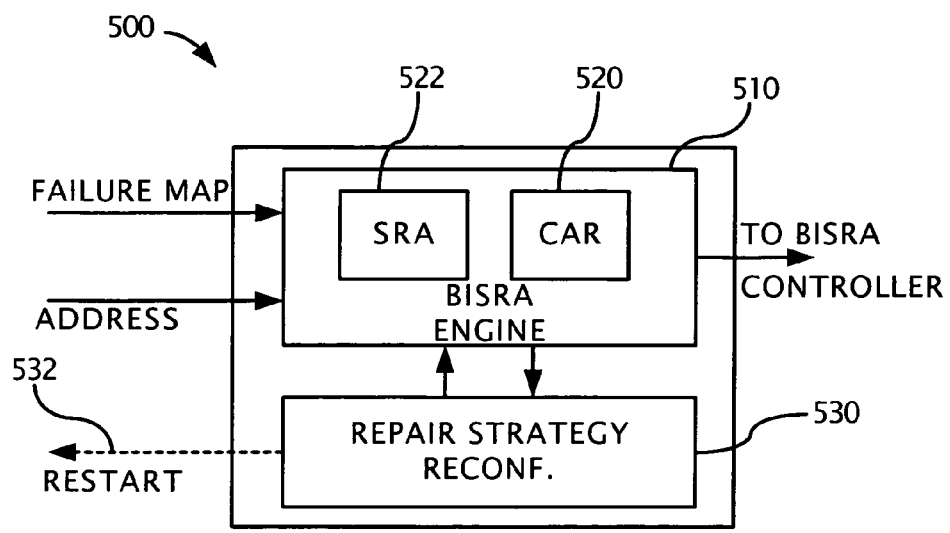
FIG. 5 is a schematic diagram showing an exemplary BISRA wrapper utilizing a single BISRA engine as can be used in the BIST architecture of FIG. 3.

The BISRA engines 410 illustrated in FIGS. 4 and 5 comprise two functional blocks: a spare-resource allocation (SRA) block 420 and a control-and-report (CAR) block 422. The SRA block 420 is configured to allocate spare memory resources according to a corresponding repair strategy. The CAR block 422 is configured to evaluate the failure maps received and determine whether or not the repair strategy for which the SRA block 420 is configured is successful. In some embodiments, the BISRA engine 410 uses a record of column defects, which is more fully described below, to store column-failure information and to enable at-speed analysis of a selected repair strategy.

In certain embodiments, if two or more BISRA engines 410 indicate that their respective repair strategies can be used successfully to repair the memory-under-test 316, a determination circuit 430 (termed an "arbiter" in FIG. 4) selects which one of the successful strategies should be used to repair the memory-under-test 316. The arbiter 430 can be configured, for example, to select the repair strategy that uses the fewest spare resources, is the first to be reported, or meets some other predetermined criteria.

According to one implementation, if the repair strategy for a respective BISRA engine 410 is successful and if the arbiter 430 selects the BISRA engine, the corresponding CAR 422 sends repair data to the BISRA controller 320 along a path 440. The repair data can include, for example, faulty row addresses and column addresses as determined, for example, from the record of column defects discussed below.

FIG. 5 illustrates another embodiment 500 of the BISRA wrapper 318. In this embodiment, only one BISRA engine 510 is used to perform the self-repair analysis of a memory-under-test 316. According to one particular embodiment, the BISRA engine 510 analyzes tests of the memory-under-test 316 using one repair strategy at a time. In some embodiments, the BISRA engine 510 can stop the self-repair analysis, for example, when one of the repair strategies succeeds in repairing the memory-under-test 316.

In the illustrated embodiment, a repair-strategy-reconfiguration (RSR) block 530 is configured to load different repair strategies into the BISRA engine 510 and to send a restart signal 532 to the BIST controller 312 used to restart the BIST. In certain embodiments, external automatic test equipment (ATE) can scan in a new repair strategy. In other embodiments, however, the new repair strategy is generated internally (e.g., via a linear feedback shift register (LFSR)). For example, if an LFSR is used to generate the repair strategy, the polynomials output from the LFSR can be configured to represent the possible repair strategies. Thus, for instance, if "1" denotes a spare row and "0" denotes a spare column and if there are two spare rows and two spare columns available for memory repair, the LFSR polynomial "1001" represents the repair strategy "RCCR." The LFSR can then be configured to produce all possible repair strategies (e.g., the LFSR can be configured to produce the exemplary sequence: 1001, 1010, 0101, 1100, 0110, 0011).

For any of the BISRA architectures described above, the BISRA controller 312 can send repair information to the external ATE after the repair analysis is performed. In one embodiment, for example, the BISRA controller 312 sends a one-bit signal to the ATE indicating that the one or more memories tested are repairable. If there is more than one memory, the BISRA controller can send a memory number to the ATE, followed by row-address and/or column-address information corresponding to the rows and/or columns to be repaired. In one implementation, a leader bit may be used to indicate whether the information being sent is a row address or a column address (e.g., a "1" can be inserted before a row address, and a "0" can be inserted before a column address). In some embodiments, two separate clock domains may be employed: a BIST-clock domain and an ATE-clock domain. In certain implementations of these embodiments, the BIST clock is the same as the system clock, whereas the ATE clock is slower. In these embodiments, BIST can be performed "at-speed" (i.e., at the operating speed of the memory-under-test). As more fully explained below, certain embodiments of the BISRA engine(s) described herein also desirably operate "at-speed," without pausing or stopping during the BIST of the memory. In some of these embodiments, post-BIST processing is used to determine whether a particular repair strategy succeeds. Faulty column and faulty row addresses can then be scanned out to the external ATE using the ATE clock. In order to reduce the likelihood of synchronization problems between the two clock domains, a two-stage synchronizer can be used.

In order to balance the overall test time with the area overhead for any of the BIST architecture described herein, it is possible to use multiple BISRA engines to analyze distinct strategies in parallel. For example, according to one embodiment, an integrated circuit can have E embedded BISRA engines that each execute C(m+n, m)/E repair strategies. Indeed, any number of BISRA engines (e.g., from two to C(m+n, m)−1) can be used to simultaneously analyze one or more repair strategies.

In order to compare the area tradeoffs between a BIST architecture using multiple BISRA engines and a BIST architecture using a single BISRA engine, experiments were performed using an exemplary memory and a variety of different possible repair strategies. The results of these experiments are shown in Table 1 below. For purposes of these experiments, a linear memory having 4096 rows and a word size of 32 bits was considered. Moreover, a BIST controller using 14N March C+ algorithms was considered.

TABLE 1

Comparison of area overhead for multiple-BISRA-engine and single-BISRA-engine implementations

| Spare Resources | C(m + n, m) engines | One engine |
| --- | --- | --- |
| 0 rows, 1 col. | 6517 | 6517 |
| 1 row, 1 col. | 11840 | 8529 |
| 1 row, 2 cols. | 16130 | 8656 |
| 2 rows, 1 col. | 18662 | 9361 |
| 2 rows, 2 cols. | 31545 | 9963 |

The first column of Table 1 lists the spare resources available to the exemplary memory. The second columns lists a combined area of the BISRA and BIST logic when a total of C(m+n, m) engines were used to perform the repair analysis. In this implementation, each engine was able to analyze a different repair strategy and all engines of the BISRA wrapper were operated simultaneously. The third column of Table 1 lists the total area of the combined BISRA and BIST logic when only a single BISRA engine was used. In this implementation, the single BISRA engine considered the various possible repair strategies sequentially. For both the second and third columns, the unit of measure is a standardized area unit and the BIST controller for the exemplary memory had a constant area of 3142 units.

As can be seen from Table 1, when only a single BISRA engine is employed, the combined BISRA/BIST area increases in relatively small amounts as additional spare resources become available. As more fully explained below, these area increases result from longer repair strategies and only a small amount of additional logic as additional spare columns are added (e.g., for implementing the column repair vector discussed below) and from additional registers used to store faulty row addresses and related report logic as additional spare rows are added. However, the overall analysis time will increase for single-BISRA-engine embodiments as additional spare resources are added because repair strategies are considered sequentially.

A comparison of the second repair strategy (1 row, 1 column) and the third repair strategy (1 row, 2 columns) shows that the BISRA area overhead increases only slightly with the addition of an extra spare column. This results from using a record of column defects, as described below, which generally does not increase in size as additional spare columns become available. As more fully explained below, however, the number of records used to store column defects may increase for multiplexed memories as the number of spare columns increases.

In contrast to the single-BISRA-engine architectures listed in the third column, the second columns shows that if C(m+n, m) engines are used, the hardware overhead increases exponentially as additional spare resources become available and the number of BISRA engines correspondingly increases. For instance, the fifth repair strategy (two rows, two columns) has a total area that is over ten times the size of the BIST controller alone (i.e., 31545/3142>10). Increases in memory size, however, will not substantially affect the area overhead of the combined BISRA and BIST logic. A larger memory will require additional memory elements for storing longer addresses, but the control logic will remain the same.

For any of the embodiments described above, column-failure information can be recorded and continuously updated in the BISRA wrapper 318 during BIST. For example, according to certain embodiments of the disclosed technology, a set of memory elements (e.g., latches or flip-flops) is utilized during BIST to maintain a record of which columns of the memory-under-test need repair without storing the particular addresses of the defective columns. This record is usually referred to herein as the record of column defects. In certain embodiments, no spare columns are assigned to repair a memory-under-test until after the words of the memory-under-test have been tested. Further, in some embodiments, the record of column defects keeps track of columns in the memory-under-test that contain defects and that are not repaired by spare rows assigned by the BISRA during BIST.

In one particular implementation, the record of column defects is termed a column repair vector (CRV) and comprises a series of bits stored in a set of memory elements (e.g., latches or flip-flops) wherein each bit of the set corresponds to a column of the memory and has a value indicative of whether an error was found in the respective column (e.g., "1" may represent a defect, whereas "0" represents no defect). The values stored in the CRV can be updated using information obtained during BIST. For example, the CRV can be updated at-speed during the memory test using the failure maps output from the BIST wrapper 314. In one particular embodiment, for example, a failure map for a word tested is logically combined (e.g., logically ORed) with previous values stored in the CRV when one or more defects found in the failure map are not repaired by a spare column or covered by the current CRV. By logically updating the CRV, the CRV continuously maintains a history of what columns in the memory-under-test are to be repaired utilizing a spare column using a minimal amount of memory resources.

Figure 6:
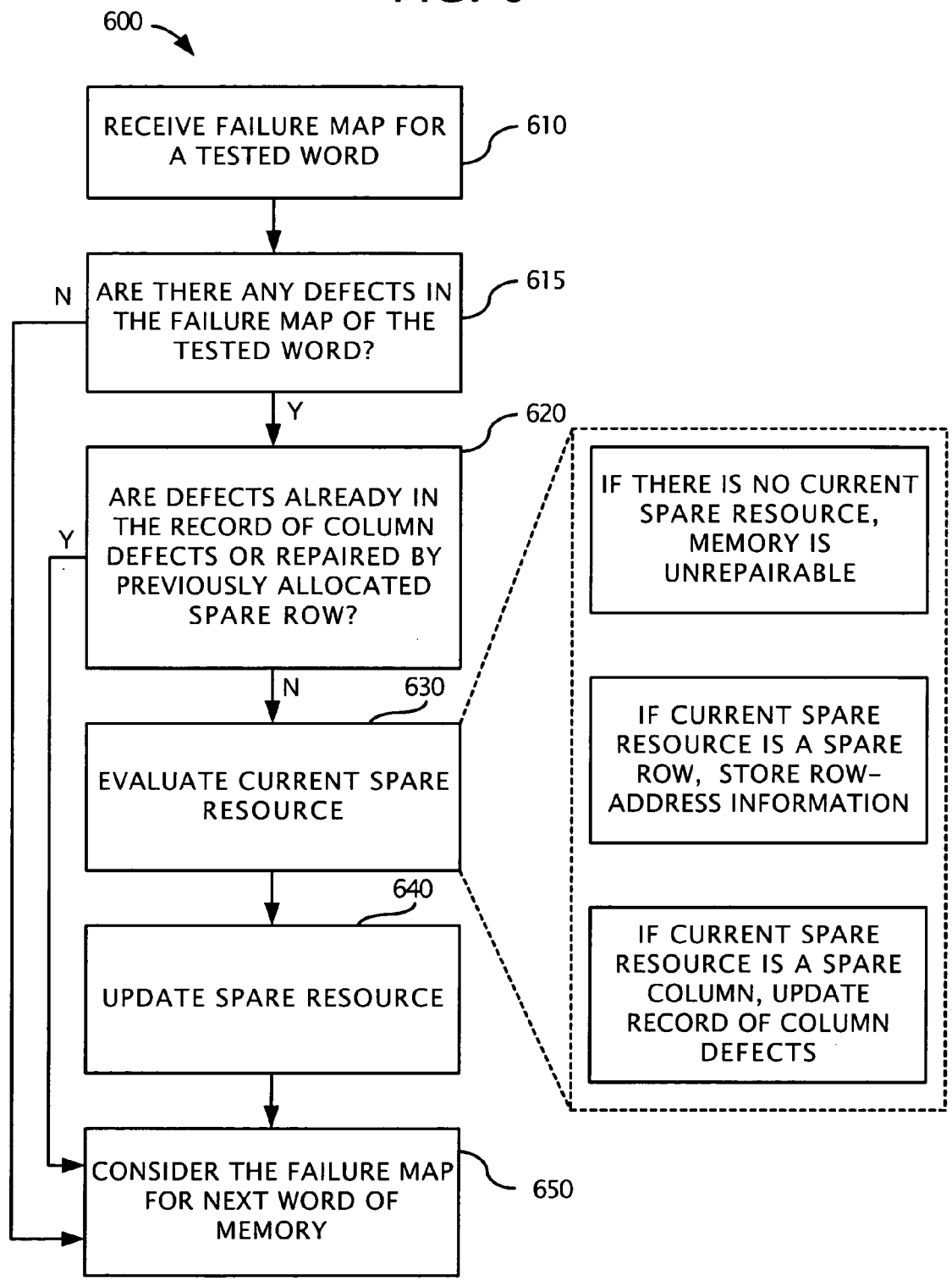
FIG. 6 is a flowchart of an exemplary method for analyzing test results during BIST for a memory having a linear architecture.

For purposes of illustrating the operation of a BISRA using a record of column defects, an exemplary method of analyzing whether a particular repair strategy can repair a memory-under-test is described with reference to FIG. 6. The exemplary method illustrated in FIG. 6 is primarily used to repair memories having a linear architecture and utilizes a CRV as the record of column defects (though any other suitable record could be used). In the exemplary method, failure maps (sometimes called defect maps) from the words tested are output from the BIST components of the chip to the BISRA components (e.g., from the BIST wrapper 314 to the BISRA wrapper 318). At process block 610, a failure map for a word being tested is received. At process block 615, the failure map is evaluated to determine which columns of the tested word, if any, have a failing or defective bit. In one embodiment, a "1" in the failure map indicates that a difference between the expected memory output and the tested memory output was found. If there is only a one-bit difference found, the failure may be termed a single-bit failure; if there are multiple-bit differences found, the failure may be termed a multiple-bit failure. If no failing bits are detected, then the method 600 is repeated for the next failure map. If one or more failing bits are identified, a determination is made at process block 620 as to whether the failing bit(s) identified in the failure map are already set in the CRV or are repairable by previously allocated spare rows. In some embodiments, however, process block 620 only involves determining whether the failing bits(s) identified in the failure map are already set in the CRV. For example, if the memory-under-test is tested multiple times using multiple different test patterns (e.g., to test different stuck-at faults), then it can be useful to check the previously allocated spare rows at process block 620. In these embodiments, the CRV and the previously allocated spare rows can be checked simultaneously such that the analysis can be performed at-speed. If the failing bit(s) are not already in the CRV and not already repaired by the allocated spare rows, then the method 600 proceeds to process block 630, otherwise the method 600 is repeated for the next failure map. At process block 630, the current spare resource (as determined by the relevant repair strategy of the BISRA engine) is evaluated. If there are no more spare resources available, then the memory is deemed unrepairable using the current repair strategy. In one embodiment, the BISRA controller may send a corresponding unrepairable signal to the external ATE or other repair hardware. In the illustrated embodiment, if the current spare resource is a spare row, then the spare row is allocated to repair the faulty row. When the spare row is allocated to the faulty row, the row address is stored in a memory of the BISRA engine (e.g., a content-addressable memory (CAM)). If the current spare resource is a spare column, however, the spare column is merely "reserved" for the defect by updating the record of column defects. In one embodiment, for instance, the spare column is reserved by updating the CRV by logically ORing the failure map with the current CRV. It should be noted that in this exemplary embodiment, only a single spare resource is evaluated per cycle. In other embodiments, however, multiple spare resources can be evaluated in a single cycle. Evaluating multiple spare resources during a single cycle, however, can slow the analysis process down and/or add significant additional logic or other area overheard. Based on these speed and area overhead concerns, it is ordinarily desirable to evaluate only a single spare resource per cycle. At process block 640, the current spare resource is updated to the next spare resource in the relevant repair strategy. At process block 650, the next word of the memory-under-test is considered.

In one embodiment, a post-BIST analysis is performed after the memory has been tested and the failure maps analyzed by a suitable analysis method, such as the method 600 described in FIG. 6. In the post-BIST method 700 illustrated in FIG. 7, for example, a determination is made at process block 710 as to whether the number of defects indicated by the record of column defects (e.g., the CRV) is greater than the number of available spare columns. If the number of defect bits set in the record of column defects is greater than the number of available spare columns, then the memory is deemed unrepairable using the current repair strategy at process block 720. If the number of defect bits set in the record of column defects is less than or equal to the number of available spare columns, however, then the memory is deemed repairable at process block 730. At process block 740, the column addresses corresponding to the defects found and the row addresses stored during BIST are sent to a repair component (e.g., an external ATE) that performs the actual repair. Thus, in certain embodiments, the spare row resources are allocated during the memory test, whereas the spare column resources are allocated after the memory test.

Figure 7:
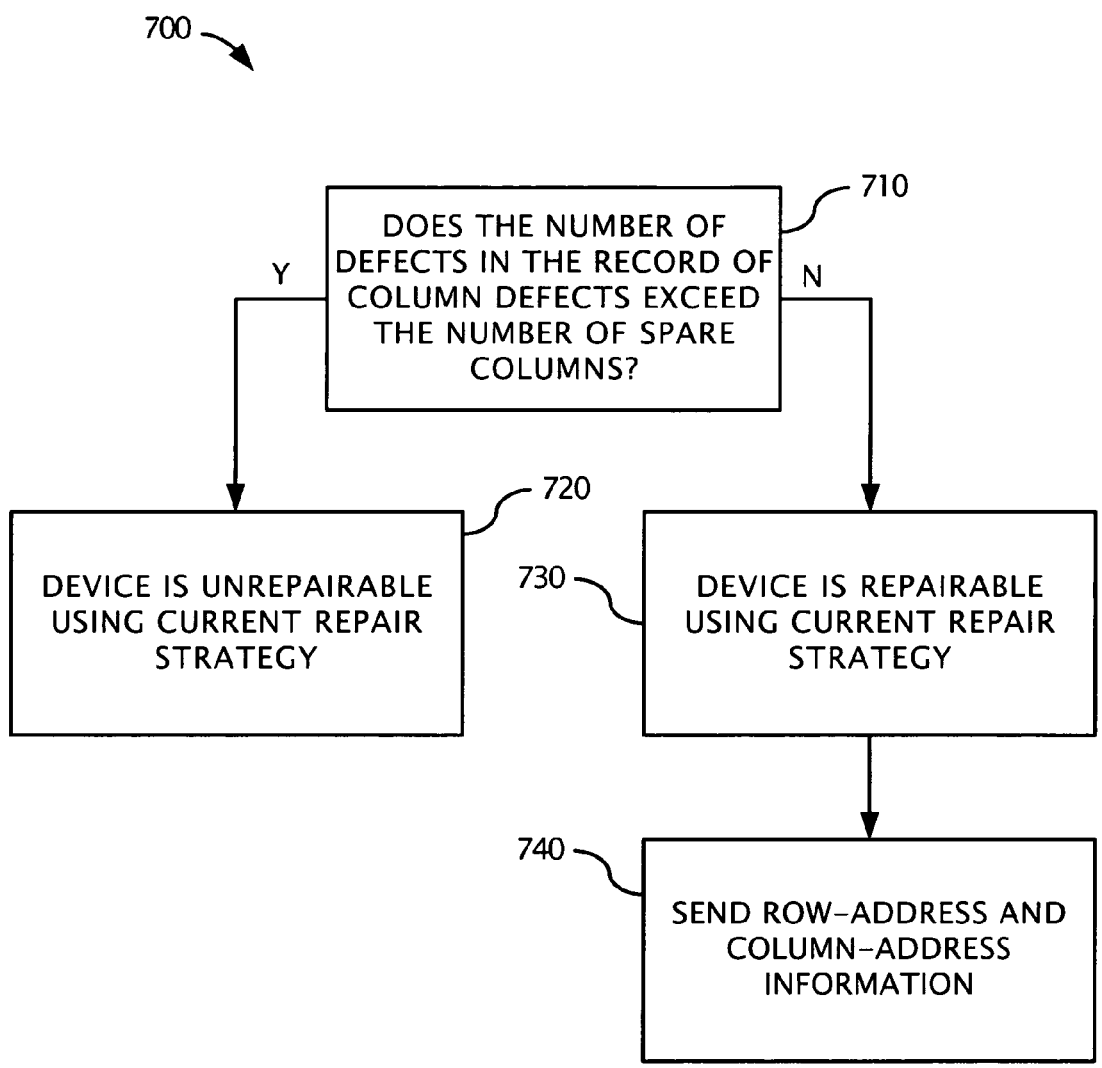
FIG. 7 is a flowchart of an exemplary method for analyzing test results after BIST.
Figures 8, 10:
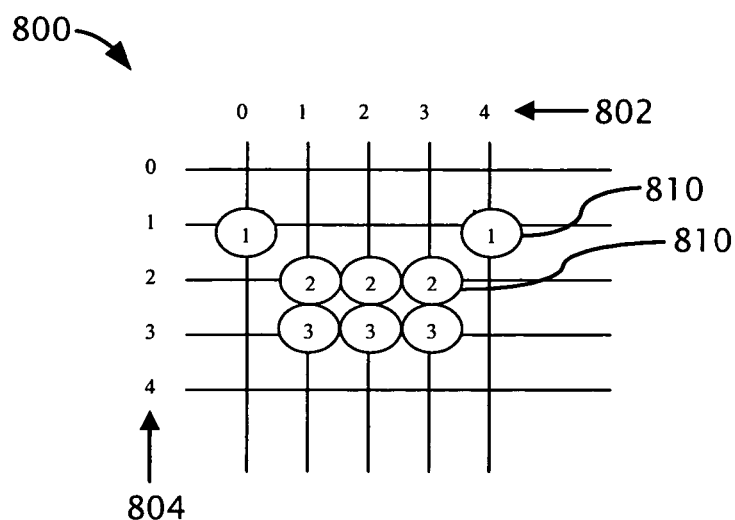
FIG. 8 is a schematic block diagram of a memory having a linear architecture comprising several memory defects used to illustrate the method of FIG. 7.
FIG. 10 is a schematic block diagram of a memory having a multiplexed architecture comprising several memory defects used to illustrate the method of FIG. 9.

FIG. 8 illustrates the methods shown in FIGS. 6 and 7. FIG. 8 is a schematic block diagram of a linear-architecture memory 800 containing several defects. The memory 800 contains memory cells that correspond to column addresses 802 and row addresses 804. Ovals 810 in FIG. 8 indicate memory cells that are defective. In this particular example, the memory 800 is tested sequentially by row, starting with row 0 and ending at row 4. The numbers inside the ovals 810 of FIG. 8 denote the order in which the errors are discovered during the test of memory 800.

For purposes of this example, assume that there are two spare columns and two spare rows available to repair the memory 800. Moreover, assume that the record of column defects is a CRV having five bits corresponding to respective columns 802. Further, assume that before the test, the CRV has been reset (e.g., to "00000") and that the repair strategy being considered is "CCRR."

At process blocks 610 and 615 of the exemplary method 600, the failure map from row 0 is received and evaluated for the presence of any defects. Because no defects are found in row 0, the failure map reads "00000" and the exemplary method proceeds to the next row. Row 1 contains two defects. Thus, in one particular implementation, the corresponding failure map reads "10001." Consequently, the exemplary method proceeds to process block 620, where it is determined that neither the bits of the CRV (which still equals "00000") nor any previously allocated spare rows cover the detected errors. At process block 630, the current spare resource is evaluated. According to the corresponding repair strategy (CCRR), a first spare column ($C_1$) is reserved for the errors and the CRV is updated by logically ORing the failure map with the current CRV (i.e., "10001"+"00000"="10001"). At process block 640, the current spare resource is updated to the next spare resource, which is the second spare column ($C_2$). At process block 650, the next word of memory and the next failure map are considered.

Row 2 contains three defects and has a failure map of "01110." Consequently, the exemplary method proceeds to process block 620, where it is again determined that neither the bits of the CRV (which now equals "10001") nor any previously allocated spare row covers the detected errors. Thus, at process block 630, the current spare resource is evaluated. As a result of the evaluation, the second spare column ($C_2$) is reserved for the errors in row 2 and the CRV is updated (i.e., "10001"+"01110"="11111"). At process block 640, the current spare resource is updated to the next spare resource, which is the first spare row ($R_1$). At process block 650, the next word of memory and the next failure map are considered.

Row 3 also contains three defects and has a failure map of "01110." Consequently, the exemplary method proceeds to process block 620. At process block 620, it is determined that the error bits detected in the failure map are covered by the current CRV. That is, each bit set in the failure map corresponds to a bit set in the CRV. Accordingly, the current spare resource is not allocated or reserved for the errors, and at process block 650, the next word of memory and the next failure map of the memory are considered.

Row 4 contains no defects, so the exemplary method terminates after process block 615. Because the exemplary memory 800 contains no further rows of memory, the BIST of the memory 800 ends and a post-BIST evaluation is performed.

In the post-BIST evaluation, a method such as the one described above with respect to FIG. 7 can be utilized. For example, according to the method shown in FIG. 7, a determination is made at process block 710 as to whether the number of bits set in the CRV is greater than the number of spare columns available. In this example, there are more bits set in the CRV than spare columns available. Thus, at process block 720, a determination is made that the memory cannot be repaired using the selected repair strategy (CCRR).

A summary of this example appears in Table 2 below:

TABLE 2

Summary of results using repair strategy: CCRR
Repair Strategy: CCRR

| BIST Read Cycle | FAIL_MAP | Current Spare | Allocated Rows | CRV |
| --- | --- | --- | --- | --- |
| 0 | 00000 | $C_1$ | — | 00000 |
| 1 | 10001 | $C_1$ | — | 10001 |
| 2 | 01110 | $C_2$ | — | 11111 |
| 3 | 01110 | $R_1$ | — | 11111 |
| 4 | 00000 | $R_1$ | — | 11111 |

As seen by the column labeled "allocated rows," no spare row is ever allocated to repair a defect when the repair strategy CCRR is analyzed according to the method 600 described above.

Now assume that the repair strategy for the BISRA engine is "CRRC." At process blocks 610 and 615 of the exemplary method 600, the failure map from row 0 is received and evaluated for the presence of any defects. Because no defects are found in row 0, the failure map reads "00000" and the method 600 proceeds to the next row.

Row 1 contains two defects. Thus, the corresponding failure map reads "10001." Consequently, the exemplary method proceeds to process block 620, where it is determined that neither the bits of the CRV (which still equals "00000") nor any previously allocated spare row covers the detected errors. At process block 630, the current spare resource is evaluated. According to the corresponding repair strategy (CRRC), the current spare resource is a first spare column ($C_1$), which is reserved for the errors. The CRV is updated by logically ORing the failure map with the current CRV (i.e., "10001"+"00000"="10001"). At process block 640, the current spare resource is updated to the next spare resource, which is the first spare row ($R_1$). At process block 650, the next word of memory and the next failure map are considered.

Row 2 contains three defects and has a failure map of "01110." Consequently, the exemplary method proceeds to process block 620, where it is again determined that neither the bits of the CRV (which now equals "10001") nor any previously allocated spare row covers the detected errors. Thus, at process block 630, the current spare resource is evaluated. As a result of the evaluation, the first spare row ($R_1$) is allocated to the errors. Because the spare resource is a spare row (not a spare column), the CRV is not updated. At process block 640, the current spare resource is updated to the next spare resource, which is the second spare row ($R_2$). At process block 650, the next word of memory and the next failure map are considered.

Row 3 also contains three defects and has a failure map of "01110." Consequently, the exemplary method proceeds to process block 620. At process block 620, it is determined that the error bits detected in the failure map are not covered by the current CRV or any previously allocated spare rows. Thus, at process block 630, the current spare resource is evaluated. As a result of the evaluation, the second spare row ($R_2$) is allocated to the error. Because the spare resource is a spare row (not a spare column), the CRV is not updated. At process block 640, the current spare resource is updated to the next spare resource, which is the second spare column ($C_2$), and at process block 650, the next word of memory and the next failure map are considered.

Row 4 contains no defects, so the exemplary method 600 terminates after process block 615. Because the exemplary memory 800 contains no further rows of memory, the BIST of the memory 800 ends and a post-BIST evaluation is performed. For example, according to the method shown in FIG. 7, a determination is made at process block 710 as to whether the number of bits set in the CRV is greater than the number of spare columns available. Here, there are the same number of bits set in the CRV as spare columns available. Thus, at process block 730, the memory is deemed repairable and, at process block 740, the corresponding column addresses and row addresses (columns 0 and 4 and rows 2 and 3) are sent to the component that performs the actual repair.

A summary of this example appears in Table 2 below:

TABLE 3

Summary of results using repair strategy: CRRC
Repair strategy: CRRC

| BIST Read Cycle | FAIL_MAP | Current Spare | Allocated Rows | CRV |
|---|---|---|---|---|
| 0 | 00000 | $C_1$ | — | 00000 |
| 1 | 10001 | $C_1$ | — | 10001 |
| 2 | 01110 | $R_1$ | $R_1$ | 10001 |
| 3 | 01110 | $R_2$ | $R_1, R_2$ | 10001 |
| 4 | 00000 | $C_2$ | $R_1, R_2$ | 10001 |

The method described above with respect to FIG. 6 can be modified slightly in order to repair memories with a multiplexed architecture. In a multiplexed architecture, a logical row in a memory consists of several words. During memory BIST, the BIST controller 312 sequentially writes and reads words from the memory. In one embodiment, a record of column defects having a size equal to the total number of bits in a row of the memory is used to implement the repair strategy. For example, for a multiplexed memory having an 8-bit word width and 32 words per row of memory (i.e., a MUX level of 32), a 256-bit CRV could be used. In this embodiment, the self-repair analysis proceeds substantially as it would with a linear-memory architecture, with some minor bit manipulation to ensure that when the record of column defects is updated with the failure map, the results are recorded in the correct bit locations of the record.

In another embodiment, the record of column defects comprises one or more word-oriented records. In one exemplary embodiment, a word-oriented record is referred to as a word-oriented column repair vector (W-CRV) and has the same width as a memory word plus an additional number of bits used to store a word position in the row. For example, for a 32-word architecture wherein each word has 8-bits, the W-CRV may be 13 bits (8 bits for error information and 5 bits for the word-address information). Thus, by storing word-address information as part of the record of column defects, the column-defect information can be stored in fewer bits than the number of bits in a row of the memory-under-test. For example, the total number of bits used to implement the W-CRVs can be less than half the number of bits in a row of the multiplexed memory. In one particular implementation, the number of word-oriented records (e.g., W-CRVs) needed for the BISRA is the number of spare columns available.

FIG. 9 is a flowchart illustrating an exemplary method 900 by which a BISRA engine may be operated to repair a memory having a multiplexed architecture. In the exemplary method 900, the record of column defects comprises multiple W-CRVs (though any equivalent word-oriented records could be used). As with the exemplary method 600 described above, failure maps are sent from the BIST components to the BISRA components during testing. At process block 910, the failure map for a word being tested is received. At process block 915, a determination is made as to whether the failure map indicates the presence of any failing bits in the current word being tested. If no failing bit(s) are detected, then the exemplary method 900 is repeated for the next failure map. If one or more failing bits are detected, a determination is made at process block 920 as to whether the failing bit(s) identified in the failure map are already repairable by previously allocated spare rows. If the failing bit(s) are not already repaired by the allocated spare rows, then the method 900 proceeds to process block 930. At process block 930, the current spare resource (as determined by the relevant repair strategy of the BISRA engine) is evaluated. If there are no more spare resources available, then, in one embodiment, the memory is deemed unrepairable using the current repair strategy. If the current spare resource is a spare row, then the spare row is allocated to repair the faulty row. When the spare row is allocated to the faulty row, the row address is also stored. If the current spare resource is a spare column, a determination is made as to whether the word in which the defect(s) are found is at a word position already stored in an existing W-CRV. If the defective word's position has already been stored, then the W-CRV corresponding to the defective word's position is evaluated to determine whether the defect(s) are already recorded in the W-CRV and, if not, the W-CRV is updated by ORing the failure map with the W-CRV. If the defective word's position has not already been stored in an existing W-CRV, and if the available W-CRVs have not all been used, then the failure map is ORed with a new W-CRV. At process block 940, the current spare resource is updated to the next spare resource (unless at process block 930 an existing W-CRV covered the defects detected) according to the relevant repair strategy. At process block 950, the next word of memory and the next failure map are considered.

To illustrate how word-oriented records of column defects, and W-CRVs in particular, can be used to analyze multiplexed memory architectures, reference is made to FIG. 10, which schematically illustrates four examples of a defective multiplexed memory 1000. For the examples shown in FIG. 10, assume that the only spare resources available are two spare columns and the word-oriented records of column defects are W-CRVs. In FIG. 10, a multiplexed memory 1000 with a word size of 8 bits and with 32 words per row (i.e., a MUX-level of 32) is schematically shown. For ease of illustration, the bits of each word are shown together, rather than physically separated as they would be in the actual multiplexed architecture (as illustrated in FIG. 2).

In case 1, for example, when the BISRA engine encounters the first error in word 31, a first W-CRV is updated to "00010000" (i.e., "00010000"+"00000000"="00010000") and word 31 is stored in the word-address bits of the W-CRV. When the BISRA encounters the second error in a different row, but in the same word position 31, the first W-CRV is updated at process block 930 with the new failure map to "00010100" (i.e., "00010000"+"00000100"="00010100"). In this case, post-BIST evaluation will determine that the repair strategy works because there are two total defective column bits and two spare column resources.

In case 2, when the BISRA engine encounters the first error in word 0, a first W-CRV is updated to "00010000" (i.e., "00010000"+"00000000"="00010000") and word 0 is stored in the word-address bits of the first W-CRV. When the BISRA engine encounters the second error in word 1, which is recognized by the BISRA engine as different than word 0, a second W-CRV is updated to "00000100" (i.e., "00000100"+"00000000"="00000100") and a word 1 is stored in the word-address bits of the second W-CRV. In this case, post-BIST evaluation will determine that the repair works because there are two total defective column bits and two spare column resources. If, however, the first W-CRV contained two defective column bits, whereas the second W-CRV contained one defective column bit, the repair strategy would fail because the number of defective columns would exceed the available spare column resources.

In case 3, a multi-bit failure occurs in word 1. When the BISRA engine encounters word 1, a first W-CRV is updated to "00100100" (i.e., "00100100"+"00000000"="00100100") and word 1 is stored in the word-address bits of the W-CRV. In this case, post-BIST evaluation will determine that the repair strategy is successful because there are two total defective column bits and two spare column resources.

In case 4, when the BISRA engine encounters the first error in word 0, a first W-CRV is updated to "00010000" (i.e., "00010000"+"00000000"="00010000") and word 0 is stored in the word-address bits of the first W-CRV. When the BISRA engine encounters the second error in word 31, a second W-CRV is updated to "00000100" (i.e., "00000100"+"00000000"="00000100") and word 31 is stored in the word-address bits of the second W-CRV. When the BISRA engines encounters the third error in word 1 and recognizes that word 1 is not stored in either the first or second W-CRVs, the repair analysis ends at process block 930 because no further spare resources are available.

Whether a single CRV or multiple W-CRVs are used to test a multiplexed memory may depend on the area overhead that results from the particular implementation. For example, assume that one row in a memory-to-be-tested has W words, that each word contains B bits, and that there are n spare columns available. If a single CRV is used, the CRV will have W(B) bits. If n W-CRVs are used, the W-CRVs will have a total of n(B) bits plus an extra n(log(W)) bits for storing the word addresses. Thus, the number of bits for the W-CRV implementation is n(B)+n(log(W)). Some algebraic manipulation shows that the same number of bits is used for a single CRV and for W-CRVs when n=(W(B))/(B+log(W)). Therefore, according to one exemplary method, a single CRV is used when n is greater than this value, and multiple W-CRVs are used when n is less than this value. Additional logic may be utilized with respect to one of the implementations and will have to be accounted for in the evaluation. Moreover, additional considerations (such as speed, ease of implementation, etc.) may affect this evaluation.

For any of the above-described methods in which multiple repair strategies are analyzed (e.g., the single BISRA engine), the time used to search for a valid repair strategy may be reduced by eliminating certain repair strategies based on analysis results from already-considered repair strategies. According to one exemplary method, the time used to search for a valid repair strategy is reduced by recognizing that whenever the number of defect bits in a CRV (or its equivalent) exceeds the total number of available spare columns, the current strategy, as well as all related strategies starting with the same sequence of spare resources up until the point of failure, will similarly fail. For instance, in a case where two spare rows and two spare columns are available and where the repair strategy is CCRR, if the number of defect bits in the CRV exceeds the total number of spare columns after the first spare resource allocation (C), then any repair strategy beginning with a spare column (C) will similarly fail. Thus, no other repair strategy that initially uses a spare column needs to be tested (e.g., CRCR and CRRC). Moreover, in certain embodiments, the BIST of the current repair strategy (here, CCRR) can be immediately aborted.

Figure 11:
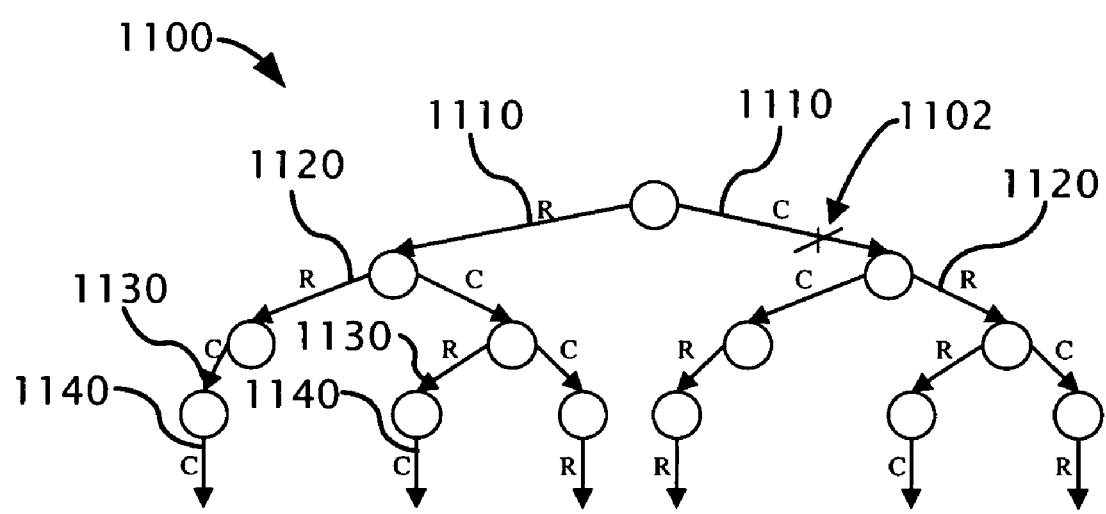
FIG. 11 is a schematic block diagram showing an exemplary selection tree for applying repair strategies.

A selection tree 1100 as illustrated in FIG. 11 may be used to determine the repair strategies that do not need to be evaluated. First branches 1110 of the tree 1100 are the first spare resources considered in the repair strategy, second branches 1120 are the second spare resources considered, and so on for third branches 1130 and fourth branches 1140. When a particular branch is found to fail (e.g., because the number of defects in the CRV is greater than the total number of spare columns), all downstream branches will similarly fail and need not be tested. Thus, the selection tree 1100 can be "pruned" at this point. For instance, using the example recited above and starting with repair strategy CCRR, assume that the number of defect bits in the CRV after the first spare-resource allocation (C) exceeds the total number of spare columns. Any repair strategy using a spare column initially will similarly fail, and the strategy tree can be "pruned" at point 1102 so that no further searches beginning with a spare column are utilized. This procedure eliminates superfluous computation and decreases the overall repair time.

Figure 12:
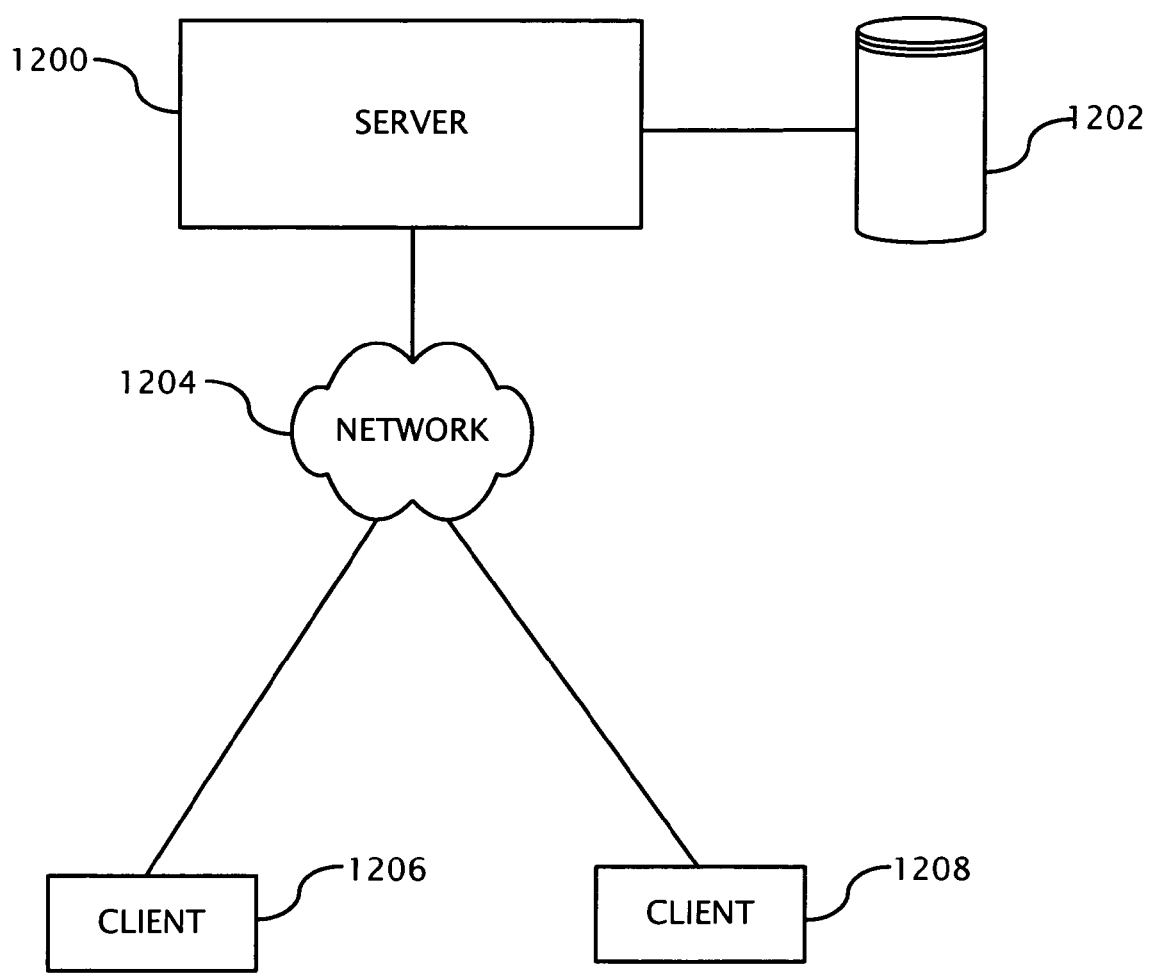
FIG. 12 is a system diagram of a client/server network as may be used in implementing the disclosed BISRA architectures.

Any of the aspects of the technology described above may be performed or designed using a distributed computer network. FIG. 12 shows one such exemplary network. A server computer 1200 can have an associated storage device 1202 (internal or external to the server computer). For example, the server computer 1200 can be configured to design BISRA components according to any of the embodiments described above (e.g., as part of an EDA software tool). The server computer 1200 may be coupled to a network, shown generally at 1204, which can comprise, for example, a wide-area network, a local-area network, a client-server network, the Internet, or other such network. One or more client computers, such as those shown at 1206, 1208, may be coupled to the network 1204 using a network protocol.

FIG. 13 shows that a database containing design information (e.g., a netlist) may be updated to include design information for BISRA components according to any of the embodiments disclosed herein using a remote server computer, such as the server computer 1200 shown in FIG. 12. In process block 1300, for example, the client computer sends design data relating to a memory to be tested or analyzed using one of the disclosed BISRA schemes. For instance, the client computer may send a netlist or other EDA design database. In process block 1302, the data is received and loaded by the server computer. In process block 1304, the database received is analyzed and a BISRA architecture according to any of the disclosed embodiments created. This new design data can be stored as an updated version of the design database or as one or more separate databases. In process block 1306, the server computer sends the updated database or other databases to the client computer, which receives the database in process block 1308. It should be apparent to those skilled in the art that the example shown in FIG. 13 is not the only way to update a design database to include the relevant BISRA design data. For instance, the design data may be stored in a computer-readable media that is not on a network and that is sent separately to the server. Or, the server computer may perform only a portion of the design procedures.

Having illustrated and described the principles of the invention by several embodiments, it should be apparent that those embodiments can be modified in arrangement and detail without departing from the principles of the invention. For example, certain memories may be tested column-by-column rather than row by row. For these memories, the disclosed methods can be modified to analyze the columns tested using, for example, a CRV which is a record of row defects. Thus, the terms row and column as used herein can be interchanged for certain memories.

The described embodiments are illustrative only and should not be construed as limiting the scope of the present invention. Rather, the present invention encompasses all such embodiments as may come within the scope and spirit of the following claims and equivalents thereto.

We claim:

1. A method of analyzing a repair strategy for a memory-under-test, comprising:
   testing words of the memory-under-test for one or more defects, the testing being performed at an operating speed of the memory-under-test;
   updating a record of column defects at substantially the operating speed of the memory-under-test, the record of column defects indicating the defects of the memory-under-test not repairable by spare rows; and
   evaluating the record of column defects after the testing to determine whether the memory-under-test is repairable using the repair strategy.

2. The method of claim 1, wherein multiple defects are found in a word tested, and the record of column defects is updated to include the multiple defects.

3. The method of claim 1, further comprising sending row-address information and column-address information to external test equipment if the evaluating determines that the memory-under-test is repairable using the repair strategy.

4. The method of claim 1, wherein the record of column defects comprises a set of bits, each bit in the set corresponding to a respective column in the memory-under-test and having a value indicative of whether a defect was found in the respective column.

5. The method of claim 1, wherein the record of column defects comprises a column repair vector comprising a series of bits stored in memory elements, each bit in the series corresponding to a respective column in the memory-under-test.

6. The method of claim 1, wherein the record of column defects is updated by logically ORing a failure map from a word-under-test with at least a portion of the current record of column defects.

7. The method of claim 1, wherein the updating is performed if a current spare resource is a spare column and if the one or more defects from a current word being tested are not found in a current record of column defects or are not covered by a previously allocated spare row resource.

8. The method of claim 1, wherein the memory-under-test is a multiplexed memory, and wherein the record of column defects comprises one or more word-oriented records each associated with a different word position in the multiplexed memory.

9. The method of claim 8, wherein each word-oriented record comprises a set of bits, a first portion of the set corresponding to respective columns in the memory-under-test and a second portion of the set corresponding to word-position information.

10. The method of claim 9, wherein the number of bits comprising the one or more word-oriented records is less than the number of bits in a row of the memory-under-test.

11. A method of testing an embedded memory of an integrated circuit, wherein the method of claim 1 is performed simultaneously for multiple different repair strategies.

12. A method of testing an embedded memory of an integrated circuit, wherein the method of claim 1 is performed sequentially for multiple different repair strategies.

13. An integrated circuit comprising a built-in self-repair analyzer configured to perform the method of claim 1.

14. A computer-readable medium storing computer-executable instructions for causing a computer system to at least partially design a built-in self-repair analyzer configured to perform the method of claim 1.

15. A computer-readable medium storing a design database that includes design information for a built-in self-repair analyzer configured to perform the method of claim 1.

16. The method of claim 1, wherein the spare rows are allocated according to the repair strategy.

17. A method for performing a self-repair analysis of a memory, the memory comprising a plurality of memory cells arranged into rows and columns, the method comprising:
receiving a failure map associated with a test of a word in the memory, the word of the memory comprising at least two memory cells from a respective row of the memory, each memory cell of the word corresponding to a different column in the respective row;
determining which columns in the word have a defect based on the failure map; and
evaluating a current spare resource if one or more defects are found in the word and are not already covered by either a record of column defects or a committed spare row resource, the act of evaluating comprising,
logically updating the record of column defects with the failure map to include the one or more defects if the current spare resource is a spare column, and
advancing the current spare resource to a next spare resource according to a selected repair strategy.

18. The method of claim 17, wherein the act of evaluating further comprises storing corresponding row information if the current spare resource is a spare row.

19. The method of claim 17, wherein the record of column defects comprises a set of bits, each bit of the set corresponding to a respective column of the memory and having a value indicative of whether a defect is found in the respective column during a memory test of multiple words in the memory.

20. The method of claim 17, wherein the record of column defects is a column repair vector comprising a set of memory elements, each memory element in the set corresponding to a respective column in the memory.

21. The method of claim 17, wherein the memory has a multiplexed architecture and the record of column defects comprises multiple word-oriented column repair vectors, wherein each word-oriented column repair vector comprises a set of memory elements, a first portion of the set corresponding to respective columns in the memory-under-test and a second portion of the set corresponding to word-position information.

22. The method of claim 17, wherein the record of column defects is updated by logically ORing the failure map with at least a portion of the record of column defects.

23. The method of claim 17, further comprising, determining whether the selected repair strategy is successful by evaluating the record of column defects as the record of column defects is updated.

24. The method of claim 17 performed simultaneously using multiple different repair strategies.

25. The method of claim 24, wherein the multiple repair strategies are analyzed using (C(m+n, m)−1) or fewer built-in self-repair analyzers.

26. The method of claim 17 performed sequentially using multiple different repair strategies.

27. An integrated circuit comprising a built-in self-repair analyzer configured to perform the method of claim 17.

28. A computer-readable medium storing computer-executable instructions for causing a computer system to at least partially design a built-in self-repair analyzer configured to perform the method of claim 17.

29. A computer-readable medium storing a design database that includes design information for a built-in self-repair analyzer configured to perform the method of claim 17.

30. A method for repairing a memory using multiple repair strategies, comprising:
in a first test of the memory, analyzing defects in the memory using a first repair strategy, the first repair strategy comprising a predetermined order of spare resources that are applied sequentially to the defects of the memory;
determining if the memory is repairable using the first repair strategy;
if the first repair strategy fails to repair the memory, identifying a failing portion of the first repair strategy corresponding to a sequence of the spare resources applied to the defects of the memory before the first repair strategy failed; and
eliminating from subsequent tests of the memory one or more other repair strategies that begin with the failing portion of the first repair strategy.

31. The method of claim 30, wherein the first test of the memory comprises:
testing words of the memory at an operating speed of the memory; and
updating a record of column defects at substantially the operating speed of the memory-under-test, the record of column defects indicating the defects not assigned to be repaired by spare rows.

32. The method of claim 30, wherein the determining is performed as the spare resources of the first repair strategy are being applied to the defects of the memory.

33. The method of claim 30, wherein the determining is performed by evaluating a record of column defects.

34. The method of claim 33, wherein the record of column defects is a column repair vector comprising a set of bits, each bit in the set corresponding to a respective column in the memory.

35. The method of claim 30, wherein the memory has a multiplexed architecture and the record of column defects comprises multiple word-oriented column repair vectors, wherein each word-oriented column repair vector comprises a set of bits, a first portion of the set corresponding to respective columns in the memory-under-test and a second portion of the set corresponding to word-position information.

36. An integrated circuit comprising a built-in self-repair analyzer configured to perform the method of claim 30.

37. A computer-readable medium storing computer-executable instructions for causing a computer system to at least partially design a built-in self-repair analyzer configured to perform the method of claim 30.

38. A computer-readable medium storing a design database that includes design information for a built-in self-repair analyzer configured to perform the method of claim 30.

39. A circuit, comprising:
a memory array comprising a plurality of memory cells, the memory cells being arranged into rows and columns, at least some of the rows in the memory array comprising one or more memory words formed from m memory cells, where m is an integer greater than or equal to two;
at least two spare memory resources, the at least two spare memory resources comprising one or more spare memory columns assignable to repair faulty columns in the memory array and one or more spare memory rows assignable to repair faulty rows in the memory array;

a built-in self-test (BIST) circuit configured to generate and apply test patterns to the memory words of the memory array and to generate failure maps and address information for the memory words tested; and a built-in self-repair analyzer (BISRA) coupled to the BIST circuit and configured to receive the failure map and the address information for the memory words tested and to evaluate one or more repair strategies for applying the spare resources to the memory array, the BISRA comprising a set of at least n memory elements that form a record of column defects, at least some of the n memory elements corresponding to respective columns of the words tested and having values indicative of whether a defect is found in the corresponding column.

40. The circuit of claim 39, wherein m is equal to n.

41. The circuit of claim 39, wherein the set of memory elements is logically updated with a respective failure map when a respective word tested contains a defect to be repaired with a spare column.

42. The circuit of claim 39, wherein the one or more repair strategies comprise a first repair strategy and a second repair strategy, and wherein the BISRA is configured to restart the BIST circuit if the first repair strategy fails and to evaluate the second repair strategy.

43. The circuit of claim 39, wherein the one or more repair strategies are a plurality of repair strategies, and the BISRA is configured to evaluate the plurality of repair strategies sequentially.

44. The circuit of claim 39, wherein the plurality of repair strategies are generated by hardware in the BISRA.

45. The circuit of claim 44, wherein the hardware in the BISRA generating the plurality of repair strategies comprises a linear feedback shift register (LFSR).

46. The circuit of claim 39, wherein the BISRA is a first BISRA of multiple BISRAs and the one or more repair strategies are a plurality of repair strategies, the multiple BISRAs being configured to evaluate the plurality of repair strategies simultaneously.

47. The circuit of claim 46, further comprising a determination circuit configured to select an optimal repair strategy from successful repair strategies evaluated by the first BISRA and the additional BISRAs.

48. The circuit of claim 39, wherein the one or more repair strategies are loaded from automatic test equipment (ATE).

49. The circuit of claim 39, wherein the memory array has a linear architecture.

50. The circuit of claim 39, wherein the memory array has a multiplexed architecture and the set of memory elements comprises multiple word-oriented column repair vectors, each word-oriented column repair vector comprising a first subset of memory elements associated with word-address information and a second subset of memory elements associated with the respective columns of the words tested and having values indicative of whether defects are found in the corresponding columns.

51. The circuit of claim 50, wherein n is less than m.

52. The circuit of claim 50, wherein n is less than m/2.

53. A computer-readable medium storing computer-executable instructions for causing a computer system to at least partially design the circuit of claim 39.

54. A computer-readable medium storing a design database that includes design information for the circuit of claim 39.

55. An integrated circuit, comprising:

a word-oriented memory;

means for testing words of the memory at an operating speed of the memory and evaluating one or more spare resources according to a repair strategy, each of the one or more spare resources comprising either a spare row or a spare column; and means for updating a record of column defects when a current spare resource being evaluated is a spare column and when one or more defects detected are not recorded in the record of column defects, the record of column defects being updated at substantially the operating speed of the memory.

56. The integrated circuit of claim 55, further comprising means for evaluating the record of column defects after the testing is performed to determine whether the memory is repairable using the repair strategy.

57. A computer-readable medium storing computer-executable instructions for causing a computer system to at least partially design the integrated circuit of claim 55.

58. A computer-readable medium storing a design database that includes design information for the integrated circuit of claim 55.

* * * * *

UNITED STATES PATENT AND TRADEMARK OFFICE
CERTIFICATE OF CORRECTION

PATENT NO. : 7,200,786 B2  Page 1 of 1
APPLICATION NO. : 10/749283
DATED : April 3, 2007
INVENTOR(S) : Cheng et al.

It is certified that error appears in the above-identified patent and that said Letters Patent is hereby corrected as shown below:

Column 23, line 32, "The circuit of claim 39" should read --The circuit of claim 43--.

Signed and Sealed this

Twenty-third Day of March, 2010

David J. Kappos
*Director of the United States Patent and Trademark Office*